(12) United States Patent　　(10) Patent No.: US 8,208,312 B1
Novosel et al.　　(45) Date of Patent: Jun. 26, 2012

(54) NON-VOLATILE MEMORY ELEMENT INTEGRATABLE WITH STANDARD CMOS CIRCUITRY

(75) Inventors: Walter Novosel, New Wilmington, PA (US); Ethan Sieg, Hermitage, PA (US); Gary Craig, Carnegie, PA (US); David Novosel, New Wilmington, PA (US); Elaine Novosel, legal representative, West Middlesex, PA (US)

(73) Assignee: Novocell Semiconductor, Inc., Hermitage, PA (US)

( * ) Notice: Subject to any disclaimer, the term of this patent is extended or adjusted under 35 U.S.C. 154(b) by 0 days.

(21) Appl. No.: 12/887,956

(22) Filed: Sep. 22, 2010

Related U.S. Application Data

(60) Provisional application No. 61/244,593, filed on Sep. 22, 2009.

(51) Int. Cl.
  *G11C 7/00* (2006.01)
(52) U.S. Cl. .............................. 365/189.011; 365/225.7
(58) Field of Classification Search ........... 365/189.011, 365/225.7
  See application file for complete search history.

(56) References Cited

U.S. PATENT DOCUMENTS

| | | | |
|---|---|---|---|
| 4,800,297 A | 1/1989 | Novosel et al. | |
| 4,801,891 A | 1/1989 | Novosel et al. | |
| 4,874,965 A | 10/1989 | Campardo et al. | |
| 4,888,497 A | 12/1989 | Dallabora et al. | |
| 5,703,804 A | 12/1997 | Takata et al. | |
| 5,737,260 A | 4/1998 | Takata et al. | |
| 5,828,596 A | 10/1998 | Takata et al. | |
| 6,158,613 A | 12/2000 | Novosel et al. | |
| 6,175,262 B1 | 1/2001 | Savelli et al. | |
| 6,477,094 B2 * | 11/2002 | Kim et al. | 365/200 |
| 6,650,143 B1 | 11/2003 | Peng | |
| 6,667,902 B2 | 12/2003 | Peng | |
| 6,671,040 B2 | 12/2003 | Fong et al. | |
| 6,700,151 B2 | 3/2004 | Peng | |
| 6,766,960 B2 | 7/2004 | Peng | |
| 6,775,171 B2 * | 8/2004 | Novosel et al. | 365/96 |
| 6,775,197 B2 | 8/2004 | Novosel et al. | |
| 6,777,757 B2 | 8/2004 | Peng et al. | |
| 6,791,891 B1 | 9/2004 | Peng et al. | |
| 6,798,693 B2 | 9/2004 | Peng | |
| 6,816,427 B2 | 11/2004 | Novosel et al. | |
| 6,822,888 B2 | 11/2004 | Peng | |
| 6,856,540 B2 | 2/2005 | Peng et al. | |
| 6,888,398 B2 * | 5/2005 | Koehl et al. | 327/525 |
| 6,898,116 B2 | 5/2005 | Peng | |
| 6,924,664 B2 | 8/2005 | Wang | |
| 6,940,751 B2 | 9/2005 | Peng et al. | |
| 6,956,258 B2 | 10/2005 | Peng | |

(Continued)

*Primary Examiner* — Michael Tran
(74) *Attorney, Agent, or Firm* — Lando & Anastasi, LLP

(57) ABSTRACT

A non-volatile memory cell and associated programming methods that allow for integration of non-volatile memory with other CMOS integrated circuitry utilizing standard CMOS processing. The non-volatile memory cell includes an antifuse element having a programming node and a capacitor element coupled to the antifuse element and configured to provide one or more voltage pulses to the programming node. The antifuse element is configured to have a changed resistivity after the programming node is subjected to the one or more voltage pulses, the change in resistivity representing a change in logic state. The antifuse element comprises a MOS transistor, its gate being coupled to one of the programming node and a control node, and its source and drain being coupled to the other one of the programming node and the control node. The MOS transistor is formed in a well and the source, drain and well are coupled to the same voltage level.

13 Claims, 3 Drawing Sheets

U.S. PATENT DOCUMENTS

| | | |
|---|---|---|
| 6,972,986 B2 | 12/2005 | Peng et al. |
| 6,992,925 B2 | 1/2006 | Peng |
| 7,031,209 B2 | 4/2006 | Wang et al. |
| 7,042,772 B2 | 5/2006 | Wang et al. |
| 7,173,851 B1 | 2/2007 | Callahan et al. |
| 7,269,047 B1 | 9/2007 | Fong et al. |
| 7,402,855 B2 | 7/2008 | Kurjanowicz |
| 7,471,540 B2 | 12/2008 | Luan et al. |
| 7,471,541 B2 | 12/2008 | Fong et al. |
| 7,511,982 B2 | 3/2009 | Kurjanowicz et al. |
| 7,586,787 B2 | 9/2009 | Vo et al. |
| 7,609,539 B2 | 10/2009 | Peng et al. |
| 7,623,368 B2 | 11/2009 | Luan |
| 7,642,138 B2 | 1/2010 | Kurjanowicz |
| 7,755,162 B2 | 7/2010 | Kurjanowicz et al. |
| 7,764,532 B2 | 7/2010 | Kurjanowicz et al. |
| 7,772,063 B2 | 8/2010 | Novosel |
| 7,817,456 B2 | 10/2010 | Kurjanowicz |
| 7,907,465 B2 | 3/2011 | Peng et al. |
| 2002/0075743 A1 | 6/2002 | Ooishi et al. |
| 2006/0232296 A1 | 10/2006 | Wang et al. |
| 2006/0233082 A1 | 10/2006 | Lee et al. |
| 2007/0008800 A1* | 1/2007 | Jenne .................. 365/225.7 |
| 2008/0074915 A1 | 3/2008 | Terzioglu et al. |
| 2009/0250726 A1 | 10/2009 | Kurjanowicz |
| 2009/0251943 A1 | 10/2009 | Kurjanowicz |
| 2009/0262566 A1 | 10/2009 | Kurjanowicz |
| 2009/0290434 A1 | 11/2009 | Kurjanowicz |
| 2010/0002527 A1 | 1/2010 | Kurjanowicz |
| 2010/0011266 A1 | 1/2010 | Kurjanowicz |
| 2010/0202183 A1 | 8/2010 | Kurjanowicz |
| 2010/0220511 A1 | 9/2010 | Kurjanowicz |
| 2010/0244115 A1 | 9/2010 | Kurjanowicz et al. |
| 2010/0259965 A1 | 10/2010 | Kurjanowicz et al. |
| 2011/0019491 A1 | 1/2011 | Kurjanowicz et al. |

* cited by examiner

NON-VOLATILE MEMORY ELEMENT INTEGRATABLE WITH STANDARD CMOS CIRCUITRY

RELATED APPLICATIONS

This application claims priority under 35 U.S.C. §119(e) to U.S. Provisional Application Ser. No. 61/244,593, entitled "NON-VOLATILE MEMORY ELEMENT INTEGRATABLE WITH STANDARD CMOS CIRCUITRY," filed on Sep. 22, 2009, which is herein incorporated by reference in its entirety. This application is related to U.S. application Ser. No. 12/889,659, entitled "METHOD OF SENSING A PROGRAMMABLE NON-VOLATILE MEMORY ELEMENT," and to U.S. application Ser. No. 12/889,653, entitled "MULTIPLE TIME PROGRAMMABLE NON-VOLATILE MEMORY ELEMENT," each filed on Sep. 24, 2010.

BACKGROUND OF INVENTION

Embodiments of the present invention relate to non-volatile memories, and more particularly, to embedded memories for combination with other integrated circuitry.

SUMMARY OF INVENTION

The present invention provides a non-volatile memory cell and associated programming methods that allow for the integration of non-volatile memory with other CMOS integrated circuitry utilizing the standard CMOS processing used to manufacture the other CMOS integrated circuitry. The non-volatile cell structure and programming methods of the present invention, therefore, provide a desirable solution for embedded memory architectures.

In accordance with an aspect of the present invention, a non-volatile memory cell is provided. The non-volatile memory cell comprises an antifuse element having a programming node, and a capacitor element. The antifuse element is configured to have changed resistivity after the programming node is subjected to one or more voltage pulses, the change in resistivity representing a change in logic state. The capacitor element is coupled to the antifuse element and is configured to provide the one or more voltage pulses to the programming node. The antifuse element comprises a MOS transistor having a gate, a source, and a drain, wherein the gate is coupled to one of the programming node and a control node, and wherein the source and drain are coupled to the other one of the programming node and the control node. In accordance with this embodiment, the MOS transistor antifuse element is formed in a well; and the source, drain and well of the MOS transistor antifuse element are coupled to the same voltage level.

In accordance with a further embodiment of the present invention, the MOS transistor antifuse element comprises an NMOS transistor in an nwell.

In accordance with another embodiment, the MOS transistor antifuse element is formed in a semiconductor substrate so that a channel region of the MOS transistor antifuse element that is under the dielectric layer is not altered by a halo implant.

In accordance with yet another embodiment, the gate of the MOS transistor antifuse element is formed above a conductive layer that shields a channel region that is under the dielectric layer so that the channel region is not altered from a halo implant.

In accordance with yet a further aspect of the present invention, in each of the above-described embodiments, the non-volatile memory cell can be formed in an integrated circuit using standard CMOS processes, and wherein the integrated circuit further includes other CMOS circuitry formed using the same CMOS processes.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1A:
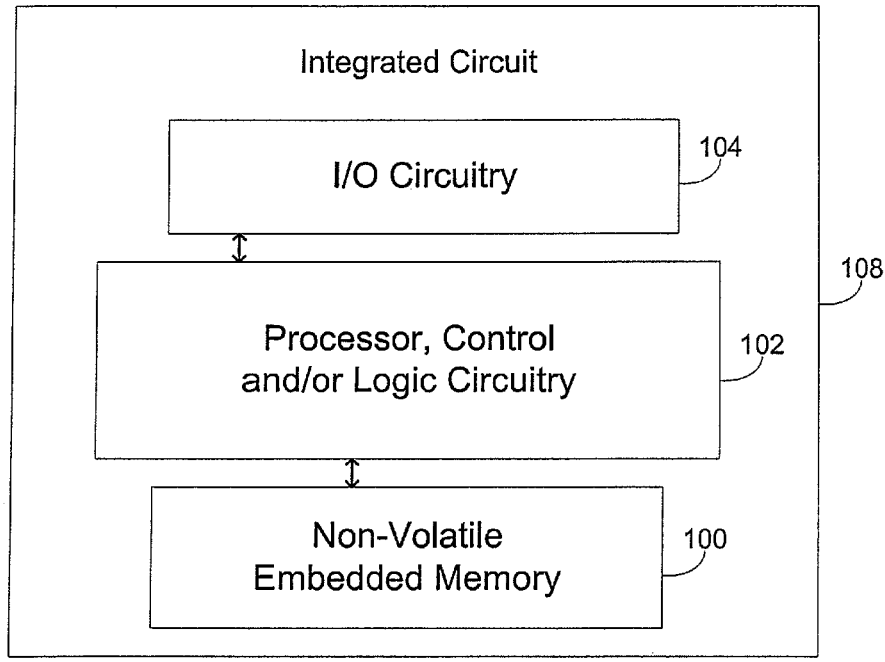
FIG. 1A is a block diagram of an integrated circuit including embedded non-volatile memory according to an aspect of the present invention.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein is meant to encompass the items listed thereafter and equivalents thereof as well as additional items.

The present invention provides non-volatile memory cell and associated programming methods that allow for the integration of non-volatile memory with other CMOS integrated circuitry utilizing the standard CMOS processing used to manufacture the other CMOS integrated circuitry. Thus, the non-volatile cell structure and programming methods, therefore, provide a desirable solution for embedded memory architectures.

FIG. 1A is a block diagram for integrated circuit 108 including embedded non-volatile memory 100 according to an aspect of the present invention. As discussed in more detail below, the non-volatile memory cell architecture of the present invention lends itself to being manufactured using standard CMOS processing. Thus, rather than requiring additional processing steps or post processing combination, the embedded non-volatile memory of the present invention can be fabricated at the same time the other circuitry is being fabricated. As such, integrated circuit 108 can include a wide variety of other circuitry as represented by input/output (I/O) circuitry 104 and processor, control and/or logic circuitry 102. It is noted, therefore, that the actual circuitry fabricated with embedded non-volatile memory 100 could vary depending upon the operational functionality desired.

Figure 1B:
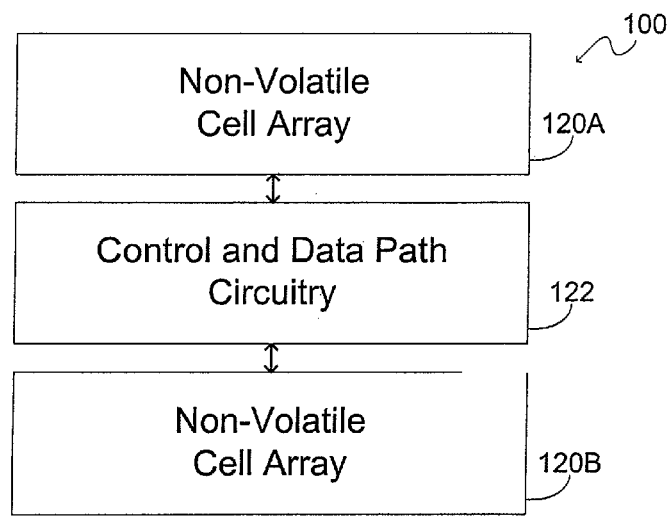
FIG. 1B is a block diagram for an embedded non-volatile memory block including a dual bank cell array.

FIG. 1B is a block diagram for an embedded non-volatile memory block 100. In the embodiment depicted, the embedded non-volatile memory block 100 has been broken into a dual bank array so that non-volatile cell array 120A and non-volatile memory cell array 120B make up the available memory for the memory block 100. Also shown is control and data path circuitry 122 that provides control and communication functions for the memory array block 100. It is noted that the actual circuitry implemented for the memory block 100 could vary depending upon the operational functionality desired.

Figure 2:
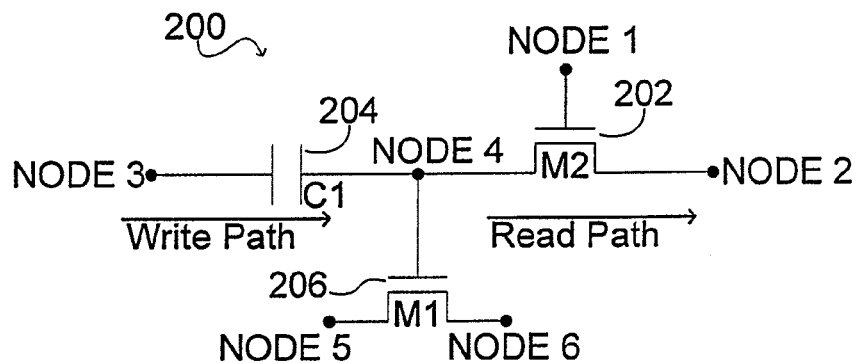
FIG. 2 is a circuit diagram of a non-volatile memory element according to an embodiment of the present invention including an antifuse element, a writing capacitor and an access transistor.

FIG. 2 is a circuit diagram for a non-volatile memory element 200 according to an embodiment of the present invention including an antifuse element (M1) 206, a writing capacitor (C1) 204 and an access transistor (M2) 202. In operation, NODE 1 is connected to the gate of the access transistor M2 to control its operation. NODE 2 is coupled through the access transistor M2 to the internal NODE 4. The capacitor C1 is connected between NODE 3 and NODE 4. NODE 4 is connected to the gate of antifuse element transistor M1. NODE 5 is connected to the source of the transistor M1, and NODE 6 is connected to the drain of transistor M1. It is noted that NODE 6 could be connected to the source of the transistor M1, and NODE 5 could connected to the drain of transistor M1 as an alternate embodiment. As shown, the transistors are NMOS devices. It is noted that PMOS transistors or other device types could be utilized for the access device. The capacitor C1 may be a MOS transistor connected such that the gate provides one terminal of the capacitor C1 and such that the source and drain are connected together to provide the other terminal of the capacitor C1. The capacitor C1 could also be formed by using two conductive layers of metal or polysilicon and a dielectric layer to form a capacitor structure. As shown, NODE 4 is connected to the gate of antifuse element transistor M1 and NODE5/6 are connected to the source/drain of the antifuse element transistor M1, respectively. It is noted that NODE 4 could be connected to both the source and the drain of the antifuse element transistor M1 and NODE5/6 could be connected together and to the gate of antifuse element transistor M1.

The non-volatile memory element 200 advantageously utilizes an antifuse element 206 that can be fabricated in standard CMOS processes without requiring special processing. This antifuse element 206 can be formed, for example, by using a standard gate oxide dielectric layer as an insulator. This insulator can then be made to become conductive by electrical means. For example, insulating layers, such as silicon dioxide ($SiO_2$), can have a voltage applied across them, and the insulator will not permit current to flow. If a sufficiently high field is applied, however, the oxide will breakdown and cause a fast discharge of the voltage across the oxide. This rapid discharge usually results in a change in the oxide or damage to the oxide that eliminates its insulating characteristic, so that the oxide will now conduct electrical current. This change in resistivity or conductive state can be used to represent the logic state of the antifuse element.

To cause the dielectric layer to become conductive, a voltage of sufficient magnitude must typically be applied across the dielectric layer. Oxides will generally become conductive with exposure to high voltages where stress is induced and charge is conducted through the oxides. Thick oxides generally behave in a manner that is typical of insulators, that is, they will tolerate an increasing field until a certain high potential, and then the oxide will break down. Below this breakdown, there is only a small current (called Fowler-Nordheim tunneling). Then, at a certain voltage level, the current will rise sharply, and significant charge will flow through the oxide. If the current is large enough, damage will occur to the oxide, and the oxide will become conductive. In some cases, one breakdown event may not be enough to cause the oxide to change permanently to a conductive state. Rather, a series of breakdown events may be needed to cause the oxide to become conductive. In thinner oxides, there can be other modes of conduction, such as direct tunneling, and these currents may prevent the easy build up of voltage across the oxide. As the voltage increases, the current through the oxide will increase, and likewise the current will decrease if the voltage is decreased. These oxides must typically conduct a significant amount of charge before the insulating characteristics are lost. This charge to breakdown ($Q_{bd}$) must be driven through the insulator to cause it to change states, from an insulator to a conductor.

In particular, in the embodiment of FIG. 2, the transistor M1 is the dielectric layer breakdown device or antifuse element. In one example, NODES 5 and 6 can be held near zero volts or ground, and NODE 4 is driven to a high voltage for writing to the antifuse device M1. To drive NODE 4 to a high voltage level, a pre-charge step may be used in conjunction with a voltage boost step. In a pre-charge step, transistor M2 is used to charge up the programming NODE 4 to a first pre-charge voltage level. To effect this pre-charge step, a voltage, such as a voltage near the supply voltage (Vdd) or preferably to a pumped supply voltage (Vpp), is applied to NODE 2 of the access transistor M2, and a voltage at least a Vth above the Vpp level is applied to NODE 1 (Vpp+Vth, where Vth is the threshold voltage of M2). This pre-charge step will drive NODE 4 to Vpp level. In the voltage boost operation, NODE 4 is first isolated by reducing the voltage at NODE 1 to a Vpp level or below thereby turning "off" the access transistor M2, and a Vpp level voltage pulse is applied to NODE 3 of capacitor C1. Due to the nature of capacitors, this action causes NODE 4 to rise along with NODE 3, thereby raising NODE 4 to a high level voltage, for example approximately 2-times Vpp or 2Vpp, assuming NODE 4 was pre-charged to a Vpp voltage level. Thus, this circuit configuration allows for raising the internal programming voltage within the non-volatile memory cell to a higher voltage, such as a voltage that is approximately 2-times the voltages being applied to the capacitor C1 and the access transistor M2.

In this write operation, therefore, the disclosed memory cell structure of FIG. 2 can double the applied voltage inside the memory element or cell 200. This capability of doubling the applied voltage in the cell is a significant benefit of the disclosed structure. This feature, therefore, allows the memory cell to be made without high voltage transistors throughout the design by confining the high voltage to a single node in the memory cell. This doubling within the cell allows the other circuitry that drives the memory core to operate at lower voltages, for example, at Vcc or Vpp. Special high voltage transistors are not required to deliver to the memory core the high voltages that are needed to write the memory elements. In the structure of FIG. 2, the high voltage appears across the dielectric layer of antifuse element M1 and is confined to NODE 4. In the example above, therefore, the voltage across the access transistor M2 and capacitor C1 is Vpp, and the voltage across the dielectric layer of the antifuse element M1 is 2Vpp. It is noted that the FIG. 2 depicts the use of an antifuse element M1 that is capable of being written to once because the dielectric layer breakdown is typically not reversible once it has occurred. However, the internal memory cell voltage doubling technique could also be used with other memory elements that could be re-writable, if desired. It is further noted that the voltage boosting technique could be utilized to drive the internal programming voltage of the non-volatile memory cell to an even higher voltages that exceed a voltage that is double the voltage being applied to the capacitor or the access device for the non-volatile memory cell, if such higher voltages were desired for a particular implementation. In addition, the voltage boosting technique could also be used to generate internal programming voltages that are higher than the applied voltages but lower than double the applied voltages. In short, a wide range of elevated voltages could be achieved, as desired, utilizing the capacitor voltage boosting technique of the present invention.

To read the state of the antifuse element M1, a voltage is applied across the antifuse element and then read circuitry will detect if there is a current flow through the dielectric layer of the antifuse element. For example, NODE 2 can be driven to an initial voltage, such as 1 volt, and NODE 1 can be driven to a positive voltage, such as Vdd. If the dielectric layer within the antifuse element M1 is conducting, a current will flow from NODE 2, through transistor M2 to NODE 4 and then NODE 5 and/or NODE 6 through the dielectric layer of antifuse element M1. If the dielectric layer within the antifuse element M1 is not conducting, then there would be no current flowing from NODE 2 to the antifuse element M1. The current flow determination and the no current flow state are then used to determine the resistivity state of the antifuse element and thereby to determine the logic state of the non-volatile memory cell 200. For example, dielectric layer breakdown and associated current flow could define a logic "1," and no current flow could define a logic "0."

As indicated above with respect to FIGS. 1A and 1B, the memory cell structure 200 of FIG. 2 can be used in an array of write-once memory cells, and the read selection of an individual cell can be done by the respective voltages applied to the NODE 1 and NODE 2 of the individual cells. For example, NODE 1 could be used to select a row of non-volatile memory cells in an array, while the column could be selected by NODE 2.

Advantageously, therefore, the benefits of the non-volatile embedded memory cell structure include: (1) a programming voltage generated internally to the memory cell, (2) no high voltage transistors needed for routing the high programming voltage to the memory cell, (3) unique selection of the memory cell is possible through the use of NODE 1 and NODE 2, and/or (4) no special structures, special processing techniques and/or process modifications are required to integrate the non-volatile memory cell structure with other CMOS circuitry.

Figure 3:
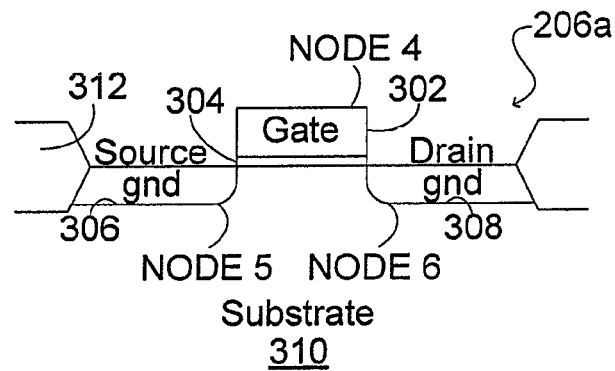
FIG. 3 is a cross-sectional diagram of a non-volatile antifuse element according to one embodiment of the present invention.

FIG. 3 is a cross-section diagram for the non-volatile antifuse element (M1) 206 according to an embodiment of the present invention. In this embodiment, the antifuse element 206a is fabricated as an NMOS transistor device. For example, the substrate 310 can be p-type with an n-type channel existing between the source 306 and the drain 308. The n-type gate 302 sits above the channel region and sits on top of a dielectric layer 304. With respect to FIG. 2, NODE 4 is connected to the gate 302, NODE 5 is connected to the source 306, and NODE 6 is connected to the drain 308. It is noted that NODE 6 could connected to the source 306, and NODE 5 could connected to the drain 308 as an alternate embodiment. In addition, as depicted in FIG. 3, the source 306 and the drain 308 are both coupled to a ground voltage level. The source 306 and drain 308 are surrounded by a dielectric layer 312 that could be field oxide, shallow trench isolation or local oxidation of silicon. It is noted that other device types could be utilized for the antifuse element, such as PMOS transistor devices, devices that have a dielectric layer positioned between two conductive layers, and/or any other device element that is configured to have different resistivity after a programming node is subjected to one or more voltage pulses such that a change in resistivity can represent a change in logic state.

The dielectric layer 304, usually silicon dioxide, requires that a certain amount of current pass through an area of the oxide to cause it to become conductive. In thicker dielectric layers, this breakdown can happen rather quickly when a large voltage is applied. Thus, a very high but very short pulse of current will often cause conduction and will generally cause conduction in the weakest part or parts of the dielectric layer. If there are several weak spots in the oxide, then current will often be shared through these weak areas. In thinner dielectric layers, however, the oxide will conduct current more uniformly across the area of the dielectric layer. As a voltage is applied, the oxide will conduct and load down the applied voltage, thereby tending to decrease the voltage across the oxide. In most cases, the available current is limited. As such, it is desirable to minimize the oxide area that is conducting and to concentrate the current in as small of an area as possible. This concentration will reduce the total amount of current that is needed to conduct through the oxide to cause breakdown and/or will reduce the time that is needed to achieve breakdown of the oxide.

With respect to FIG. 3 and dielectric layer 304, therefore, it is desirable to fabricate the antifuse element 206a with a minimal area for the dielectric layer 304. For example, the area of the dielectric layer 304 may be fabricated using minimum dimensions for the gate oxide area that are allowed with respect to the integrated circuit being fabricated. These minimum dimensions are typically provided by the manufacturer, and no structure can typically be used in the layout of the memory element that is smaller than the dimensions allowed by the manufacturing processing being utilized.

With respect to FIG. 3 and the breakdown of the dielectric layer 304, the structure will show characteristics similar to a diode after the breakdown has occurred. When the dielectric layer 304 breaks down, a conductive path is formed from the gate 302 to the substrate 310 and from substrate 310 to the source 306 or drain 308. For example, the substrate 310 can be p-type with an n-type source 306 and drain 308. The n-type gate 302 sits above the channel region and sits on top of a dielectric layer 304. The conductive path from the n-type gate 302 to the p-type substrate 310 will be a diode and the conductive path from the p-type substrate 310 to the n-type source 306 or drain 308 will be a diode. The diode from the p-type substrate 310 to the n-type source 306 or drain 308 will be shorted out since they are both tied to ground. The p-n junction between the n-type gate 302 and the p-type substrate 310 will require a higher voltage on the gate 302 to sense the dielectric layer 304 break down since the channel must be inverted.

Figure 4:
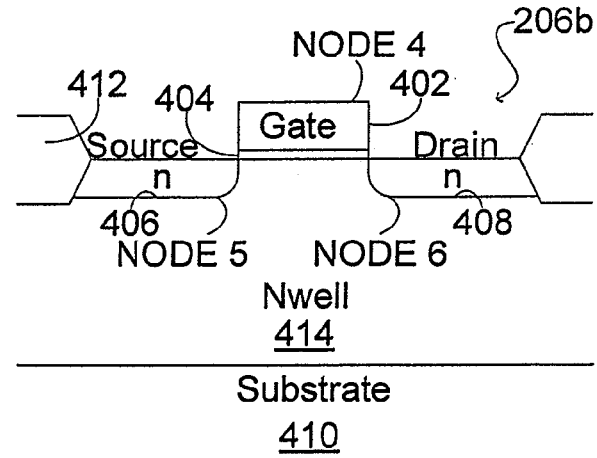
FIG. 4 is a cross-sectional diagram of a non-volatile antifuse element fabricated as an NMOS transistor device in an nwell according to another embodiment of the present invention.

FIG. 4 is a cross-section diagram for an improved non-volatile antifuse element (M1) 206 according to another embodiment of the present invention. In this embodiment, the antifuse element 206b is fabricated as an NMOS transistor device in an nwell. This structure is commonly known as a varactor because a capacitance variation results from the device transitioning from accumulation to depletion. The NFET in Nwell accumulation mode varactor is a popular approach in realizing MOS varactors.

With respect to FIG. 4 and the breakdown of the dielectric layer 404, the structure will show characteristics similar to a resistor after the breakdown has occurred. When the dielectric layer 404 breaks down, a conductive path is formed from the gate 402 to the nwell 414 and from nwell 414 to the source 406 or drain 408. The conduction between the gate 402 and the nwell 414 will have a resistive characteristic. The conduction between the nwell 414 and the source 406 or drain 408 will have a resistive characteristic. For example, the nwell 414 can be n-type and sit above a p-type substrate 410. The n-type source 406 and drain 408 sits above the n-type nwell 414. The n-type gate 402 sits above the channel region and sits on top of a dielectric layer 404. The conductive path from the n-type gate 402 to the n-type nwell 414 will be resistive and the conductive path from the n-type nwell 414 to the n-type source 406 or drain 408 will be resistive. This eliminates the diode characteristics and does not require a higher voltage on the gate 402 to sense the dielectric layer 404 breakdown. This improved non-volatile antifuse element (M1) 206b fabricated as an NMOS transistor device in an nwell will have a lower sense voltage.

Figure 5:
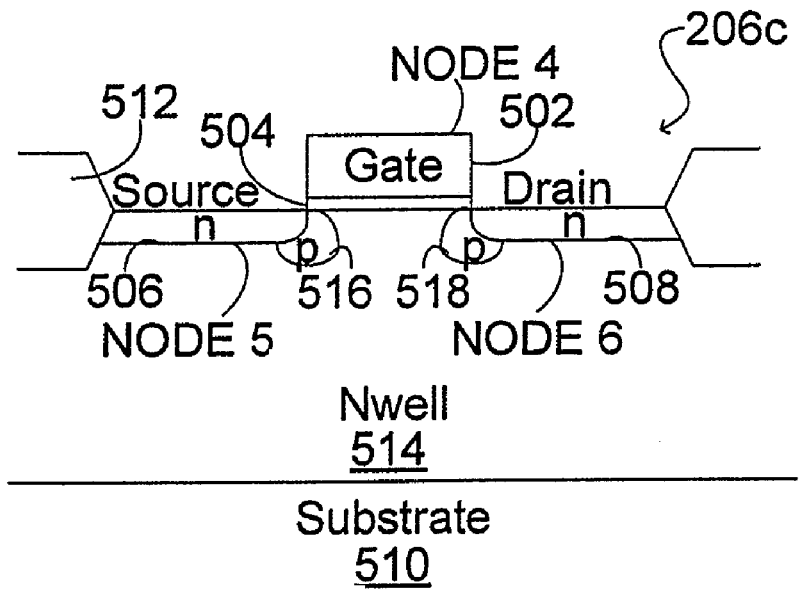
FIG. 5 is a cross-sectional diagram of a non-volatile antifuse element implemented as an NMOS transistor device in an nwell with a halo implant in the fabrication according to yet another embodiment of the present invention.

As devices are scaled to shorter channel lengths, pocket or halo implants have been used widely to reduce drain induced barrier lowering (DIBL) and other short channel effects. FIG. 5 is a cross-section diagram for the non-volatile antifuse element (M1) 206 according to another embodiment in which the antifuse element 206c is implemented as an NMOS transistor device in an nwell with a halo implant in the fabrication flow. The halo implant is a high-angle implant introduced in the same lithography step used to dope the source/drain extension regions. The halo implant uses the same implant type as the original well dopant (for example, N type dopant for the Nwell of the PMOS device). This implant step involves lightly-doped p-type doping of the regions beneath the source/drain regions of the transistor. For example, the nwell 514 can be n-type and sit above a p-type substrate 510. The n-type source 506 and drain 508 sits above a halo implant p-type source 516 and drain 518 region and sits above the n-type nwell 514. The n-type gate 502 sits above the channel region and sits on top of a dielectric layer 504. The conductive path from the n-type gate 502 to the n-type nwell 514 will be resistive and the conductive path from the n-type nwell 514 to the halo implant p-type source 516 and drain 518 region will be a diode. The conductive path from the halo implant p-type source 516 and drain 518 region to the n-type source 506 or drain 508 will be a diode. The breakdown of the dielectric layer 504 could occur over the halo region 516/518 or it may occur over the nwell 514. In either case, there will be a p-n junction which will require a higher voltage on the gate 502 to sense the dielectric layer 504 breakdown. The use of halo implants helps with control of the short transistors in a given technology, but it introduces an undesirable diode in the non-volatile antifuse element (M1) 206c. The halo may or may not produce a diode characteristic during the sensing of the antifuse element (M1) 206c, depending upon its doping level and thickness. The p-type halo region may be small enough such that the p-n junction behaves like a resistor.

Figure 6:
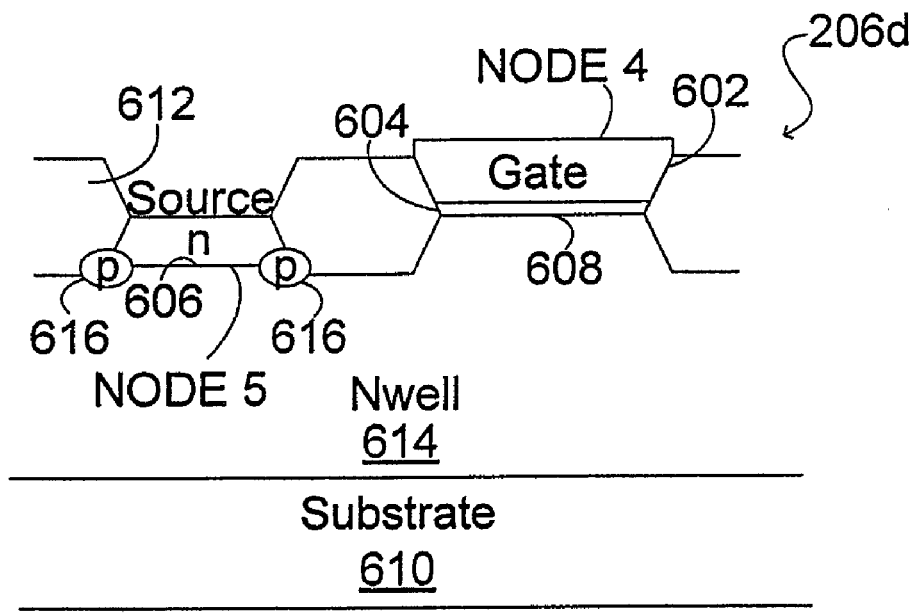
FIG. 6 is a cross-section of a non-volatile antifuse element fabricated as an NMOS transistor device in an nwell with a halo implant in the fabrication according to yet another embodiment of the present invention where the antifuse element is not altered by the halo implant.

FIG. 6 is a cross-section diagram for an improved non-volatile antifuse element (M1) 206 according to another embodiment in which the antifuse element 206d is implemented as an NMOS transistor device in an nwell with a physical structure to avoid the halo implant in the antifuse element (M1) 206d. In this embodiment, the antifuse element 206 is fabricated as an NMOS transistor device in an nwell with gate 602 situated above a bottom plate 608 to avoid having the halo implant alter the channel region. This structure is a two terminal device with the source 606 as a contact to the nwell 612 being the one terminal and the gate 602 being the other terminal.

With respect to FIG. 6 and the masking of the halo implant in the channel region, a typical process flow to fabricate a MOS transistor having a pocket or halo implant is now described with respect to FIG. 6. A dielectric layer 604 such as silicon dioxide has been formed in a typical manner, such as by thermal growth or chemical vapor deposition (CVD). A polysilicon gate 602 is formed over the silicon dioxide layer 604 in a typical manner, such as by deposition of polysilicon over the silicon dioxide layer 604 with subsequent patterning and etching to for the gate structure 602. The pocket or halo is then implanted, this being an ion implantation of the opposite conductivity type as the well. Since there are not source or drain regions next the gate 602, there will not be any halo regions in the channel region.

With respect to FIG. 6 and the breakdown of the dielectric layer 604, the structure will show characteristics similar to a resistor after the breakdown has occurred. When the dielectric layer 604 breaks down, a conductive path is formed from the gate 602 to the bottom plate 608, from bottom plate 608 to the nwell 614, and from the nwell 614 to the source 606. The conduction between the gate 602 and the source 606 will be resistive. For example, the nwell 614 can be n-type and sit above a p-type substrate 610. The n-type source 606 sits above the n-type nwell 614. The n-type gate 602 sits above the channel region and sits on top of a dielectric layer 604 which sits on top of the bottom plate 608. The conductive path from the n-type gate 602 to the n-type channel region 608, from the n-type channel region 608 to the n-type nwell 614, and from the n-type nwell 614 to the n-type source 606 will be resistive. This eliminates the diode characteristics and does not require a higher voltage on the gate 602 to sense the dielectric layer 604 breakdown. This improved non-volatile antifuse element (M1) 206d fabricated as an NMOS transistor device in an nwell will have a lower sense voltage.

The benefits of using an NMOS transistor device in an nwell with a physical structure to avoid the halo implant in the antifuse element 206d, therefore, include: (1) making more consistent the resistance of the conductive oxide by causing the breakdown to occur consistently and (2) avoids having a diode in the conduction path. It is noted that the use of an NMOS transistor device in an nwell with a physical structure to avoid the halo implant in the antifuse element could be implemented and configured in a variety of ways, as desired, to achieve the advantages provided by the use of this embodiment. FIG. 6 simply provides one example of how an alteration of the physical structure could be utilized to focus current flow and oxide breakdown.

The above described structures produce antifuse elements that can be programmed with internally generated high voltage. Preferably, the single pulse could be used to cause breakdown and write the antifuse element. However, it may often be the case that a single pulse of sufficient voltage may not be practical and that available on-chip voltages for a single pulse may be insufficient to breakdown the structure. In such cases, therefore, a programming method can be utilized, such as a series of voltage pulses, to make sure that the element is programmed by quickly reaching the required $Q_{bd}$ to cause breakdown of the dielectric layer.

As discussed above with respect to FIG. 2, the breakdown charge is supplied by the capacitor C1, and this charge is limited by the amount of charge stored by the capacitor. In other words, the current through the oxide is dependent on the applied voltage and capacitance, and to increase the current through the oxide, a maximum voltage is desirably applied.

The structure of FIG. 2 relies upon the charge stored in the capacitor C1, and as the current flows through the dielectric layer, the voltage on the capacitor C1 decreases. This decrease in voltage will cause a significant decrease in current flow. Therefore, to quickly attain the $Q_{bd}$ through the dielectric layer, the capacitor C1 can be recharged shortly after it is boosted, so that the voltage can be restored and again applied to the dielectric layer. This repetitive charging and boosting to apply high voltage peaks to the dielectric layer will tend to maximize the current flow through the oxide and allow the element to be programmed in a short time period.

Thus, to better utilize the above described structure for a programmable memory element, it is desirable to utilize a programming method that rapidly and frequently pulses the memory element with high voltages pulses. This pulsing will then produce the required current through the oxide to cause the degradation and subsequent breakdown that is required to program or write the antifuse element. The actual implementation can be done in many ways. However, two basic approaches to writing the antifuse element with this multiple pulse technique include: (1) using a fixed amount of pulses that can be applied rapidly and then sensing the state of the cell to see if the write is complete, and (2) using pulses and continuously monitoring the state of the cell to detect if the write has completed. The second technique, however, has the drawback that the frequency of the pulses may be limited to allow time for the state of the element to be correctly detected.

The rapid pulse cycle followed by a verification cycle provides a number of advantages, including: (1) sufficient current can be supplied by rapid pulses, (2) a small capacitor can be exchanged for large number of pulses of current within the antifuse element 206, and (3) high frequency operation can result in relatively fast program times.

Having thus described several aspects of at least one embodiment of this invention, it is to be appreciated various alterations, modifications, and improvements will readily occur to those skilled in the art. For example, equivalent elements may be substituted for those illustrated and described herein and certain features of the invention may be utilized independently of the use of other features, all as would be apparent to one skilled in the art after having the benefit of this description of the invention. Such alterations, modifications, and improvements are intended to be part of this disclosure, and are intended to be within the scope of the invention. Accordingly, the foregoing description and drawings are by way of example only.

What is claimed is:

1. A non-volatile memory cell formed in a semiconductor substrate comprising:
   an antifuse element having a programming node, the antifuse element being configured to have changed resistivity after the programming node is subjected to one or more voltage pulses, the change in resistivity representing a change in logic state; and
   a capacitor element coupled to the antifuse element and configured to provide the one or more voltage pulses to the programming node;
   wherein the antifuse element comprises a MOS transistor having a gate, a source, and a drain, the gate being coupled to one of the programming node and a control node and the source and drain being coupled to the other one of the programming node and the control node;
   wherein the MOS transistor antifuse element is formed in a well having a first type of conductivity that is opposite to a second type of conductivity from which the substrate is formed and the source and drain of the MOS transistor antifuse element have the first type of conductivity, and wherein the source, drain and well of the MOS transistor antifuse element are configured to be coupled to the same voltage level.

2. The non-volatile memory cell of claim 1, wherein the first type of conductivity is type n and the second type of conductivity is type p and the MOS transistor antifuse element comprises an NMOS transistor formed in an nwell.

3. The non-volatile memory cell of claim 1, wherein the MOS transistor antifuse element is formed in the semiconductor substrate so that a channel region of the MOS transistor antifuse element that is under a dielectric layer is not altered by a halo implant.

4. The non-volatile memory cell of claim 1, wherein the gate of the MOS transistor antifuse element is formed above a conductive layer that shields a channel region that is under a dielectric layer so that the channel region is not altered from a halo implant.

5. The non-volatile memory cell of claim 1, wherein the non-volatile memory cell is formed in an integrated circuit using standard CMOS processes and wherein the integrated circuit further includes other CMOS circuitry formed using the same standard CMOS processes.

6. The non-volatile memory cell of claim 5, wherein a dielectric layer that is formed below the gate has an area corresponding to a minimum dimension of the standard CMOS processes used to fabricate the integrated circuit.

7. The non-volatile memory cell of claim 2, wherein the source and drain of the NMOS transistor antifuse element are surrounded by a dielectric layer.

8. The non-volatile memory cell of claim 7, wherein the NMOS transistor antifuse element includes p type halo implants adjacent the source and drain and below the gate.

9. The non-volatile memory cell of claim 1, wherein the source and drain of the MOS transistor antifuse element are surrounded by a dielectric layer.

10. A non-volatile memory cell formed in a semiconductor substrate having a first type of conductivity, comprising:
    an antifuse element having a programming node, the antifuse element being configured to have changed resistivity after the programming node is subjected to one or more voltage pulses, the change in resistivity representing a change in logic state; and
    a capacitor element coupled to the antifuse element and configured to provide the one or more voltage pulses to the programming node;
    wherein the antifuse element is formed in a well having a second type of conductivity that is opposite to the first type of conductivity and includes a source region and a gate region, the source region having the second type of conductivity and being formed in the well and the gate region having the second type of conductivity and being spaced apart from the source region and formed on a dielectric layer that is formed on the well.

11. The non-volatile memory cell of claim 10, wherein the antifuse element includes halo implants having the first type of conductivity that are formed in the well adjacent the source region.

12. The non-volatile memory cell of claim 11, wherein the dielectric layer is formed above a conductive layer that shields a channel region that is under the dielectric layer so that the channel region is not altered by the halo implants.

13. The non-volatile memory cell of claim 12, wherein the gate region and the source region are surrounded by a second dielectric layer.

* * * * *